United States Patent [19]

Nagashima et al.

[11] 4,349,585

[45] Sep. 14, 1982

[54] GOLD-PLATED ELECTRONIC COMPONENTS AND PROCESS FOR PRODUCTION THEREOF

[75] Inventors: Teruyoshi Nagashima; Akio Takami; Akiyo Kasugai, all of Aichi, Japan

[73] Assignee: NGK Spark Plug Co., Ltd., Aichi, Japan

[21] Appl. No.: 248,375

[22] Filed: Mar. 27, 1981

Related U.S. Application Data

[62] Division of Ser. No. 72,750, Sep. 5, 1979.

[30] Foreign Application Priority Data

Sep. 5, 1978 [JP] Japan ............................. 53-108976

[51] Int. Cl.$^3$ ............................................. B05D 5/12
[52] U.S. Cl. ................................... 427/125; 427/123; 427/305; 427/377; 427/383.7; 427/383.9; 427/405; 427/438; 204/37 R; 204/40; 204/43 T
[58] Field of Search .............. 427/438, 123, 125, 405, 427/377, 383.7, 383.9, 305, 437; 204/37 R, 43 T, 40

[56] References Cited

U.S. PATENT DOCUMENTS

| | | | |
|---|---|---|---|
| 2,453,757 | 11/1948 | Renzoni | 204/37 R |
| 3,350,180 | 11/1967 | Croll | 427/129 |
| 3,778,576 | 12/1973 | Anderson et al. | 200/268 |
| 3,804,726 | 4/1974 | Passal | 204/43 T |
| 4,013,488 | 3/1977 | Ramquist et al. | 204/37 R |
| 4,153,453 | 5/1979 | Hart et al. | 204/43 T |
| 4,232,060 | 11/1980 | Mallory, Jr. | 427/438 |

OTHER PUBLICATIONS

Endicott et al., Proceedings of the American Electroplaters Society, Jan. 1966.
Brenner, Electrodeposition of Alloys, vol. II, 1963 Academic Press, N.Y., pp. 250–253.

Primary Examiner—Norman Morgenstern
Assistant Examiner—Richard Bueker
Attorney, Agent, or Firm—Sughrue, Mion, Zinn, Macpeak & Seas

[57] ABSTRACT

Gold-plated electronic components are disclosed, as well as a process for producing the same, wherein an alloy of nickel and cobalt or an alloy containing these elements as essential ingredients is used as an undercoat for the gold-plated layer.

5 Claims, 1 Drawing Figure

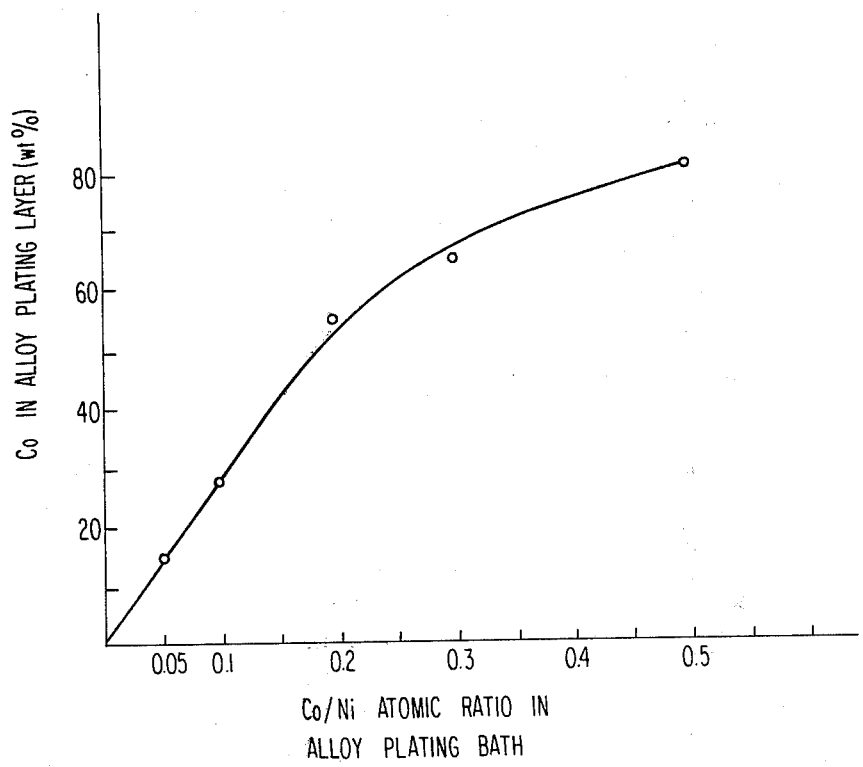

GOLD-PLATED ELECTRONIC COMPONENTS AND PROCESS FOR PRODUCTION THEREOF

This is a division of application Ser. No. 72,750, filed Sept. 5, 1979.

BACKGROUND OF THE INVENTION

1. Field of the Invention

This invention relates to gold-plated electronic components and, more specifically, to electronic components of high quality having a thin gold-plated layer and to a method for their production.

2. Description of the Prior Art

Because of its superior physical properties, gold has been widely used as a plated layer on various electronic components. When gold is used in electronic components composed of metallized ceramics, it exhibits good connecting properties in bonding, brazing, soldering, etc. Since gold is very expensive, it is desired to use it in a layer having the smallest possible thickness. In spite of this strong incentive, it has not been realized for one or more reasons. For example, when the gold-plated layer is made thin, an undercoat of plated Ni or Cu, or the metallized layer diffuses into the gold-plated layer because such an undercoat layer or the metallized layer cannot be made compact, i.e., pore free. On the other hand through pinholes in the gold coating, the undercoat layer is degenerated, and discolored under heat. There are further deteriorations in heat resistance and connecting properties, such as the peeling of a silicon tip, deterioration of bonding, and poor cap attachment of an Au/Sn seal. Thus, despite the high cost, a thick gold-plated layer has been required.

SUMMARY OF THE INVENTION

In view of the state of art, extensive investigations of electronic components having a metal surface which do not undergo deterioration in performance even when overcoated with a thin gold-plated layer have been made. These investigations have led to the discovery that such electronic components can be provided by applying a plating of a special alloy as an undercoat layer for gold plating.

The present invention provides an electronic component having a metal surface and a gold-plated layer applied to the metal surface in which a plated layer of an alloy of nickel and cobalt or an alloy containing these metals as essential ingredients is applied to the metal surface as an undercoat for the gold-plated layer; and a process for producing such an electronic component.

BRIEF DESCRIPTION OF THE FIGURE

The FIGURE is a graph showing variations in the Co/Ni ratio in an alloy coating when it is applied from an alloy plating both having various Co/Ni ratios.

DETAILED DESCRIPTION OF THE INVENTION

The present invention is concerned with electronic components having a gold-plated layer on a metal surface. There is no particular restriction on the metal surface to which the gold-plated layer can be formed by the present invention. Examples of the metal surface are metals which constitute ordinary electronic components such as copper, iron and aluminum, and ceramic substrates whose surfaces are metallized with materials composed mainly of tungsten, molybdenum, or mixtures thereof. Gold-plated electronic equipment includes, for example, circuit boards for hybrid IC, IC package boards, LSI packages, boards for LED, microswitches, small switches, and connector plugs. Gold is used for a variety of purposes including the wire bonding, tip attachment and soldering (including sealing) of electronic component parts, the provision of conductors and contacts, and also for rust-proofing of these parts. The present invention is applicable to all of these applications.

The present invention is characterized by applying a plated layer of an alloy of nickel and cobalt or an alloy containing these metals as essential ingredients as an undercoat for the gold-plated layer in these electronic components. The method of applying the alloy plating is not limited. It is formed in a thickness of about 0.1 to 10 microns, preferably about 0.5 to 5 microns, by electroplating, electroless plating, etc. The preferred content of cobalt in the alloy is from about 2 to 60% by weight, and especially from about 7 to 40% by weight. In most cases the balance of the alloy is nickel. If the cobalt content is less than 2% by weight, the heat resistance and connecting property of the resulting alloy coating are not improved appreciably. On the other hand, if the cobalt content exceeds 55% by weight, solderability becomes inferior, and moreover, this is economically disadvantageous because cobalt is much higher in price than nickel. In electroless plating, when sodium hypophosphite is used as reducing agent, the alloy will be 2 to 60% cobalt, 88 to 30% nickel and the remainder, about 10% phosphorus. When sodium borohydride is used as reducing agent, the alloy will be 2 to 60% cobalt, 95–37% nickel and the remainder, about 3% boron. Hydrazine can also be employed as reducing agent.

The plating conditions for the alloy layer are not limited. In the case of electrolytic plating ordinary Ni plating conditions may be used such as 40° to 60° C. and a current density of 1 A/dm$^2$. In the case of electroless plating, when a hypophosphite group is used as reducing agent, the liquid temperature is 90° to 95° C. When a borohydride is used as reducing agent, liquid temperature is 70° to 80° C.

Preferably, the alloy-plated layer is treated in a nonoxidizing atmosphere, such as nitrogen, ammonia-decomposition gas, or hydrogen gas at a temperature of at least about 700° C. and preferably about 700° to 1000° C. This makes the alloy coating compact, i.e., free from pores, and increases adhesion between the plated layer and its substrate.

The present inventors have examined the Co/Ni atomic ratio in the alloy coating prepared from an alloy plating bath having varying Co/Ni atomic ratios, and found that as shown in the FIGURE, cobalt deposits preferentially to nickel. To maintain the Ni/Co atomic ratio in the alloy coating constant, it is necessary to supply Co to the plating bath. A supplemental solution for this purpose should contain Ni and Co in a lower Ni/Co atomic ratio than the Ni/Co atomic ratio of the alloy plating bath. A Co/Ni atomic ratio of 0.01 to 0.3 and preferably 0.03 to 0.15 is suitable for the plating bath, but the ratio may vary outside these ranges. A plated coating of uniform quality can be obtained by performing the plating of the alloy while adding a supplemental solution. Ni and Co can also be supplied from the anode in addition to from the solutions.

After the alloy coating is formed by the above method, gold plating is performed in a known manner.

Conventional electronic components have a gold plated layer usually having a thickness of about 2 to 4 microns, although the thickness varies depending upon the uses of the components. In contrast, in the present invention, the same performance can be obtained even when the thickness of the gold coating is decreased by 1 to 2 microns because a plated layer of an alloy of nickel and cobalt or an alloy containing these metals as main ingredients is formed as an undercoat for the gold-plated layer. For example, in a ceramic package for LSI, a gold-plated layer usually having a thickness of about 3 to 4 microns is formed when a nickel plated layer is applied as an undercoat. In contrast, in the present invention, the provision of a gold-plated layer having a thickness of about 1.5 to 2 microns is sufficient. The same performance as in conventional articles can be obtained even when the thickness of the gold coating is reduced. This is presumably because the inclusion of cobalt in the undercoat layer greatly inhibits the diffusion of the elements of the undercoat layer into the gold, for example, the diffusion of nickel to gold, and thus makes it possible to retain the purity of the gold-plated layer.

In spite of the thin gold-plated layer in the electronic equipment in accordance with this invention, good performance is obtained. Accordingly, the cost of production can be maintained low, and the present invention has much practical utility.

The following Examples illustrate the present invention in greater detail. It should be understood that the invention is not limited by these Examples.

EXAMPLE 1

A metallized layer composed mainly of W was printed on green sheets formed from alumina and a resin. The green sheets were laminated and sintered to produce a standard side-braze type LSI ceramic package. A coating 2 microns in thickness having an Ni/Co ratio varying as shown in the table was formed from a plating bath consisting of a Watt bath as a base and cobalt sulfate as to use it as an undercoat for a gold coating. Then, a gold-plated layer, 1.5 microns thick, was formed from a commercially available gold plating bath ("Tempelex 401", a trademark for a product of Tanaka Noble Metals Co., Ltd.). Various properties of the resulting product were evaluated.

Testing Methods (1) Die Bonding Test

A silicon tip was bonded while it was scribed in $N_2$ gas at 450° C. Those products in which at least 90% of the area around the tip was wetted with an Au/Si eutectic alloy were regarded as acceptable.

(2) Aging Test

A die-bonded sample was allowed to stand in $N_2$ gas at 300° C., and the tip was pushed with a force of 500 g at 0, 15, 30, 50, 75, 150 and 200 hours to determine at which time peeling of the tip occurred. Those products in which the tip did not peel for at least 30 hours were regarded as acceptable.

(3) Lid Seal Test

A 1.0 t Kovar cap (with a gold plated-layer of 2.0 microns in thickness) was sealed in a hydrogen furnace at 300° C. for 6 minutes using a 50μ thick 80 Au/20 Sn preform. Then, a He leak test was conducted in accordance with MIL-STD 883, 1014, and those products which did not show leakage were regarded as acceptable.

(4) Lead Bending Test

A load was exerted on the lead to perform a bending test in accordance with MIL-STD 883,2004. Those products in which the plated coating was not peeled or cracked were regarded as acceptable.

(5) Solderability Test

A lead was dip-soldered in accordance with MIL-STD 883, 2003 and those products in which at least 95% of the lead was wetted with the solder were regarded as acceptable.

(6) High Temperature Standing Test

Samples were allowed to stand in atmospheric air at 175° C. for 250 hours, and those products which did not develop rust were regarded as acceptable.

For each sample tested 10 runs were made. The number of unacceptable runs out of the 10 in each of the above tests (1) to (6) is shown in the following table. As is clearly seen from the table, when cobalt is included in a nickel plated undercoating, the results in each test are improved.

TABLE

| Sample No. | Co(%) in Ni Plating | Die Bonding Before Aging[2] | Die Bonding After Aging[2] | Aging Test Before Aging (hours) | Aging Test After Aging (hours) | Lid Seal Test Before Aging | Lid Seal Test After Aging | Lead Bending Test Before Aging | Lead Bending Test After Aging | Solderability Test Before Aging | Solderability Test After Aging | High Temperature Standing Test Before Aging | High Temperature Standing Test After Aging |
|---|---|---|---|---|---|---|---|---|---|---|---|---|---|
| 1 | 0 | 2 | 4 | 15 | 0 | 1 | 1 | 0 | 0 | 1 | 3 | 2 | 3 |
| 2[1] | 0 | 0 | 0 | 30 | 15 | 0 | 0 | 0 | 0 | 0 | 1 | 0 | 1 |
| 3 | 1.2 | 1 | 0 | 30 | 15 | 0 | 1 | 0 | 0 | 1 | 1 | 1 | 1 |
| 4 | 2.3 | 0 | 0 | 50 | 30 | 0 | 0 | 0 | 0 | 0 | 0 | 0 | 1 |
| 5 | 5.2 | 0 | 0 | 75 | 50 | 0 | 0 | 0 | 0 | 0 | 0 | 0 | 1 |
| 6 | 7.5 | 0 | 0 | 150 | 50 | 0 | 0 | 0 | 0 | 0 | 0 | 0 | 0 |
| 7 | 10.2 | 0 | 0 | 200 | 75 | 0 | 0 | 0 | 0 | 0 | 0 | 0 | 0 |
| 8 | 21.3 | 0 | 0 | >200 | 150 | 0 | 0 | 0 | 0 | 0 | 0 | 0 | 0 |
| 9 | 30.6 | 0 | 0 | " | " | 0 | 0 | 0 | 0 | 0 | 0 | 0 | 0 |
| 10 | 39.5 | 0 | 0 | " | " | 0 | 0 | 0 | 1 | 0 | 0 | 0 | 0 |
| 11 | 52.4 | 0 | 0 | " | " | 0 | 0 | 3 | 2 | 0 | 0 | 0 | 0 |
| 12 | 58.0 | 0 | 0 | 150 | 75 | 0 | 0 | 5 | 5 | 0 | 2 | 0 | 0 |
| 13 | 69.3 | 0 | 0 | " | " | 0 | 0 | 10 | 7 | 0 | 5 | 1 | 2 |
| 14 | 76.5 | 1 | 0 | 75 | 50 | 0 | 1 | 10 | 7 | 3 | 5 | 3 | 5 |
| 15 | 83.7 | 0 | 0 | 50 | 30 | 1 | 1 | 10 | 10 | 5 | 7 | 4 | 7 |

[1]Sintered in $H_2$ atmosphere at 800° C.
[2]Aging was conducted by heating gold-plated test pieces in the air at 450° C. for 10 minutes to impart an aging effect (i.e., to impart a corroding effect in the process).

EXAMPLE 2

Example 1 was repeated except that 5% of Fe was included in an Ni/Co alloy. Substantially the same results as in Example 1 were obtained.

While the invention has been described in detail and with reference to specific embodiment thereof, it will be apparent to one skilled in the art that various changes and modifications can be made therein without departing from the spirit and scope thereof.

What is claimed is:

1. A process for producing an electronic component having a gold-plated layer applied to an undercoat layer, comprising the steps of:

forming said undercoat layer on a metal surface of said electronic component as an undercoat layer for said gold-plated layer, said undercoat layer being a plated layer comprised of an alloy of cobalt and nickel, said undercoat layer being formed from an alloy plating bath containing cobalt and nickel;

adding, simultaneously, to said bath, a supplemental solution comprising nickel and cobalt in a lower nickel/cobalt ratio than that in said bath; and treating said formed undercoat layer in a non-oxidizing atmosphere at a temperature of about 700° C. or more and forming a gold layer on said undercoat layer.

2. A process for producing an electronic component having a gold-plated layer applied to an undercoat layer, as claimed in claim 1, wherein said cobalt and nickel comprise the main ingredient of said bath.

3. A process for producing an electronic component having a gold-plated layer applied to an undercoat layer, as claimed in claim 1, wherein said treating of said formed undercoat layer in said non-oxidizing atmosphere is conducted at a temperature of between 700° C. to 1000° C.

4. A process for producing an electronic component having a gold-plated layer applied to an undercoat layer, as claimed in claim 1, wherein said bath has a cobalt-to-nickel atomic ratio of 0.01 to 0.3.

5. A process for producing an electronic component having a gold-plated layer applied to an undercoat layer, as claimed in claim 4, wherein said cobalt-to-nickel ratio is from 0.03 to 0.15.

* * * * *